United States Patent [19]
Hieda et al.

[11] Patent Number: 5,138,412
[45] Date of Patent: Aug. 11, 1992

[54] DYNAMIC RAM, HAVING AN IMPROVED LARGE CAPACITANCE

[75] Inventors: Katsuhiko Hieda, Yokohama; Akihiro Nitayama, Kawasaki; Fumio Horiguchi, Tokyo, all of Japan

[73] Assignee: Kabushiki Kaisha Toshiba, Kawasaki, Japan

[21] Appl. No.: 636,556

[22] Filed: Jan. 7, 1991

Related U.S. Application Data

[63] Continuation of Ser. No. 393,944, Aug. 15, 1989, abandoned.

[30] Foreign Application Priority Data

Sep. 30, 1988 [JP] Japan .................. 63-243871

[51] Int. Cl.$^5$ ............... H01L 29/78; H01L 27/10; H01L 27/15
[52] U.S. Cl. .................. 357/23.6; 357/45; 357/71; 357/59
[58] Field of Search ............ 357/23.6, 45, 59; 351/71

[56] References Cited

U.S. PATENT DOCUMENTS

| | | | |
|---|---|---|---|
| 4,460,911 | 7/1984 | Salters | 357/23.6 |
| 4,700,457 | 10/1987 | Matsukawa | 437/52 |
| 4,896,197 | 1/1990 | Mashiko | 357/23.6 |
| 4,974,100 | 11/1990 | Taguchi et al. | 357/23.6 |
| 5,053,351 | 10/1991 | Fazan et al. | 357/23.6 |

FOREIGN PATENT DOCUMENTS

| | | | |
|---|---|---|---|
| 168528 | 1/1986 | European Pat. Off. | 357/23.6 |
| 0194682 | 9/1986 | European Pat. Off. | 357/23.6 |
| 3910033 | 10/1989 | Fed. Rep. of Germany | 357/23.6 |
| 56-8871 | 1/1981 | Japan . | |
| 59-104161 | 6/1984 | Japan | 357/23.6 |
| 62-193168 | 8/1987 | Japan | 357/23.6 |
| 63-95657 | 4/1988 | Japan . | |
| 0180066 | 3/1989 | Japan . | |

OTHER PUBLICATIONS

Extended Abstracts of the 20th Conference on Solid State Devices and Materials, T. Kisu et al; Aug. 24–26, 1988; pp. 581–584.
International Electron Devices Meeting Technical Digest; T. Ema et al; pp. 592–595; Dec. 11–14, 1988.
Extended Abstract of the 20th (1988 International) Conference on Solid State Devices and Materials, Tokyo, 1988, pp. 581–584.

*Primary Examiner*—Andrew J. James
*Assistant Examiner*—Stephen D. Meier
*Attorney, Agent, or Firm*—Oblon, Spivak, McClelland, Maier & Neustadt

[57] ABSTRACT

A dynamic RAM comprises a semiconductor substrate, first and second MOS transistor formed on said semiconductor substrate, each having a source, a drain, and a gate, a first insulation film formed on said first and second MOS transistors, a first electrode formed on said first insulation film, for accumulating an electrical charge, the first electrode extending through a first hole made in the first insulation film and connected to one of the source and drain of said first MOS transistor, a second electrode formed on the first insulation film, for accumulating an electrical charge, the second electrode extending through a second hole made in the first insulation film and connected to one of the source and drain of the second MOS transistor, and at least one part of the second electrode being spaced apart from, located above, and overlapping part of the first electrode, first and second capacitor-insulating films formed on the first and second electrodes, respectively, and a capacitor electrode fromed on the first and second capacitor-insulating films and having a portion interposed between the overlapping parts of the first and second electrodes.

12 Claims, 16 Drawing Sheets

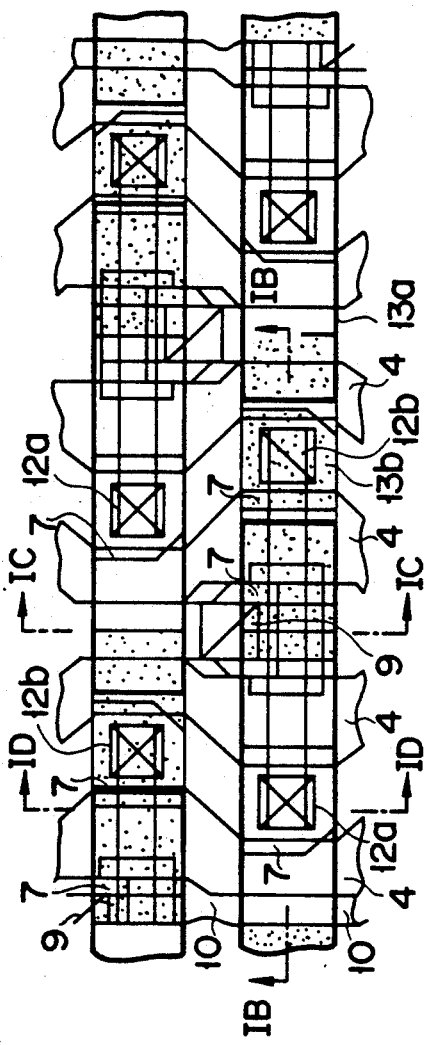
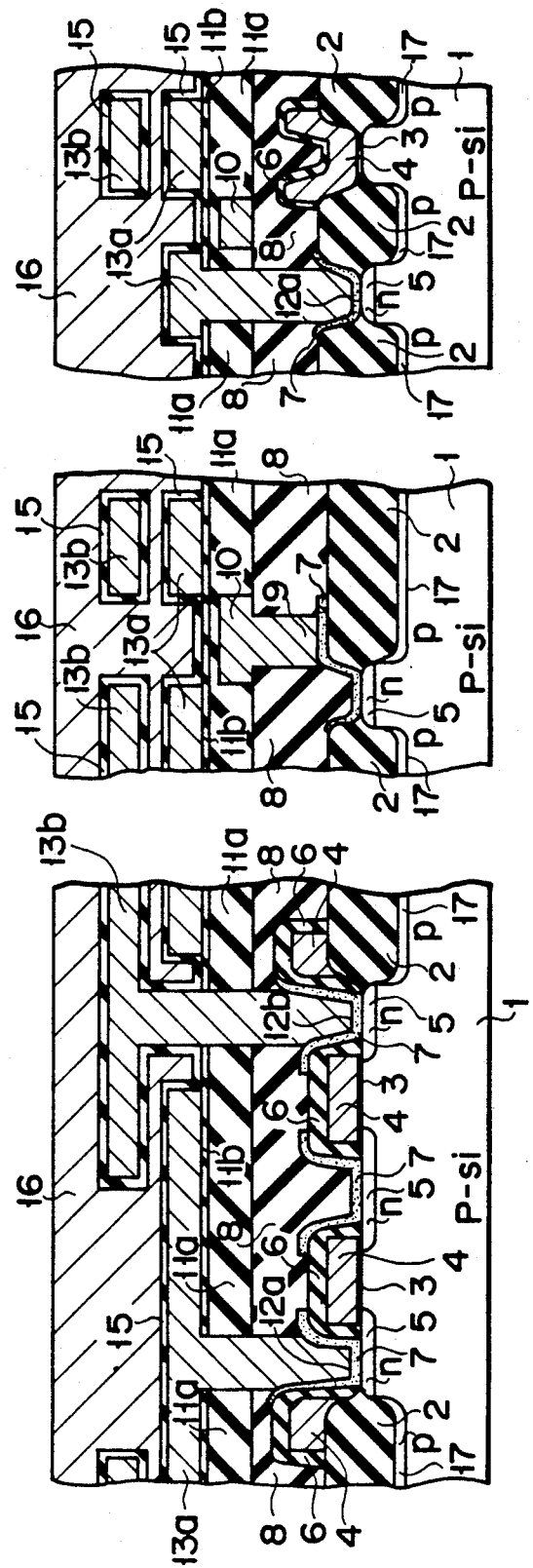

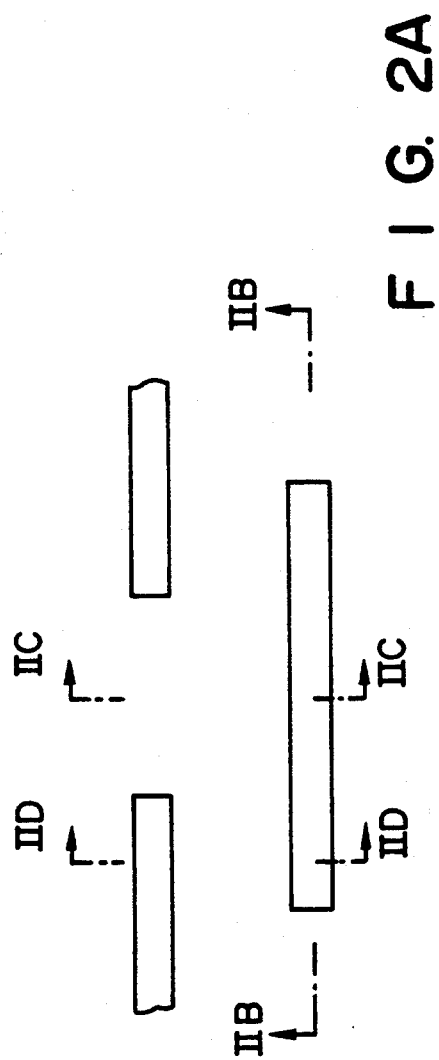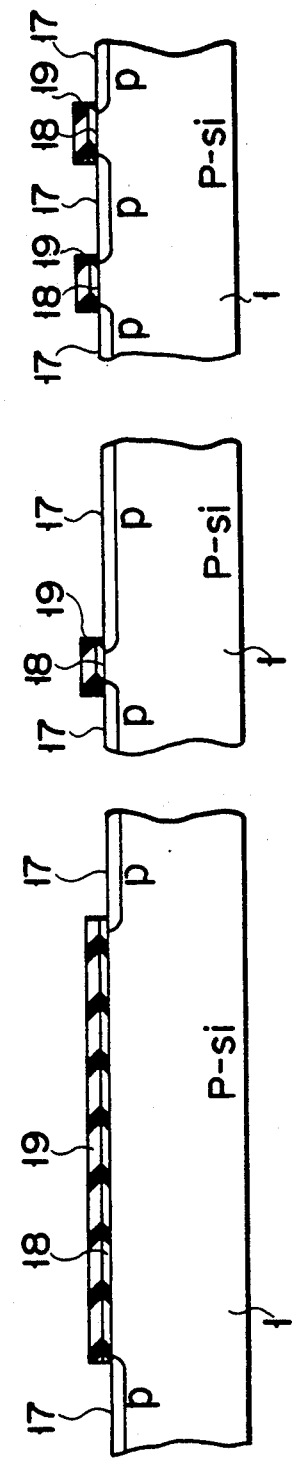
FIG. 2A  FIG. 2B  FIG. 2C  FIG. 2D

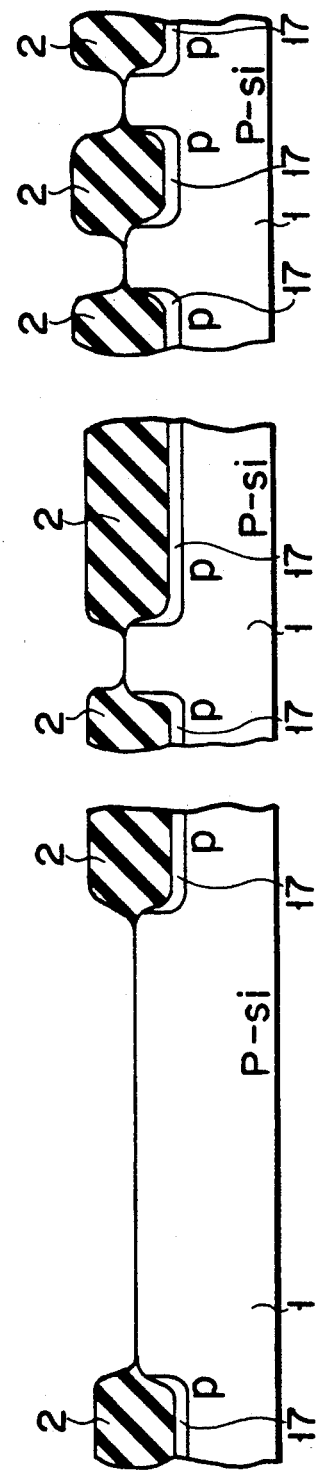
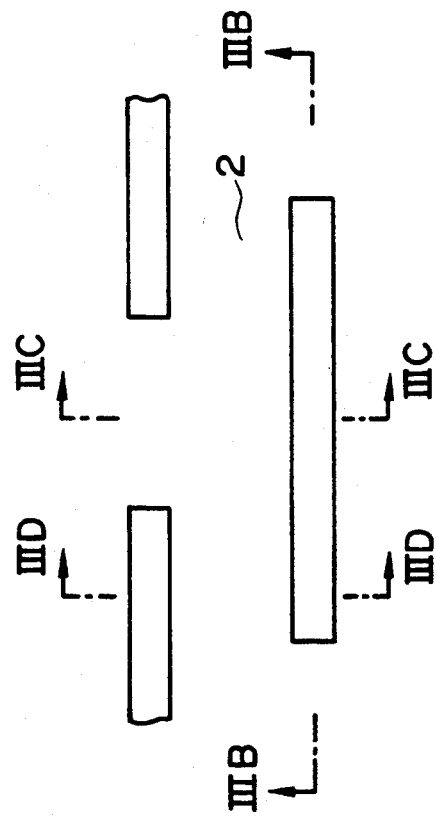
FIG. 3A
FIG. 3B  FIG. 3C  FIG. 3D

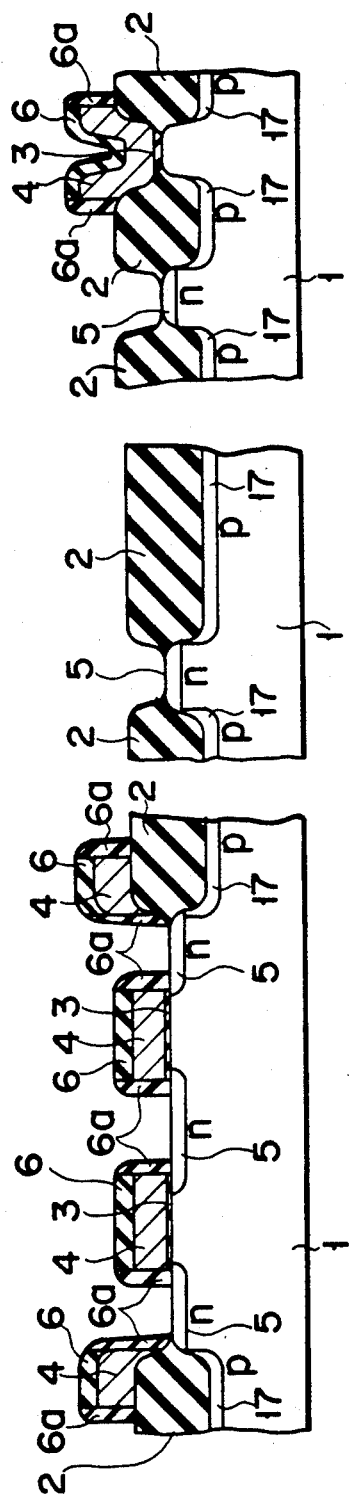
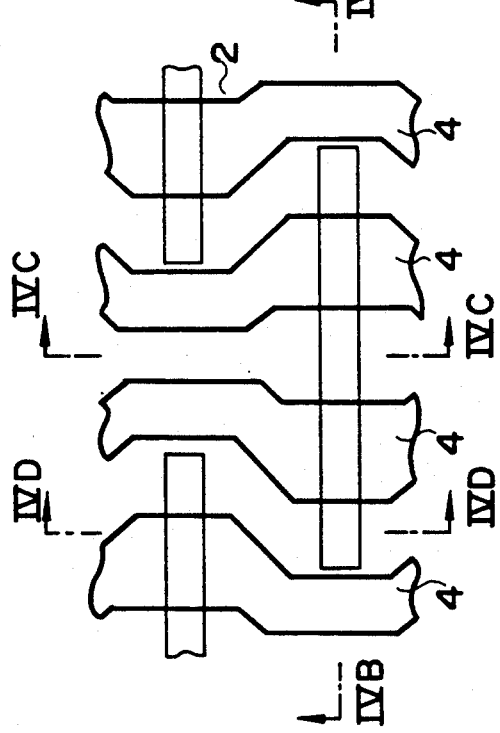
FIG. 4A  FIG. 4B  FIG. 4C  FIG. 4D

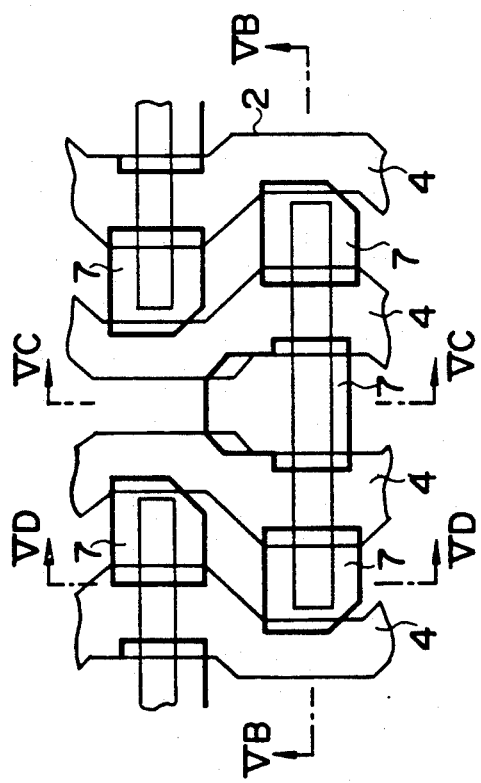
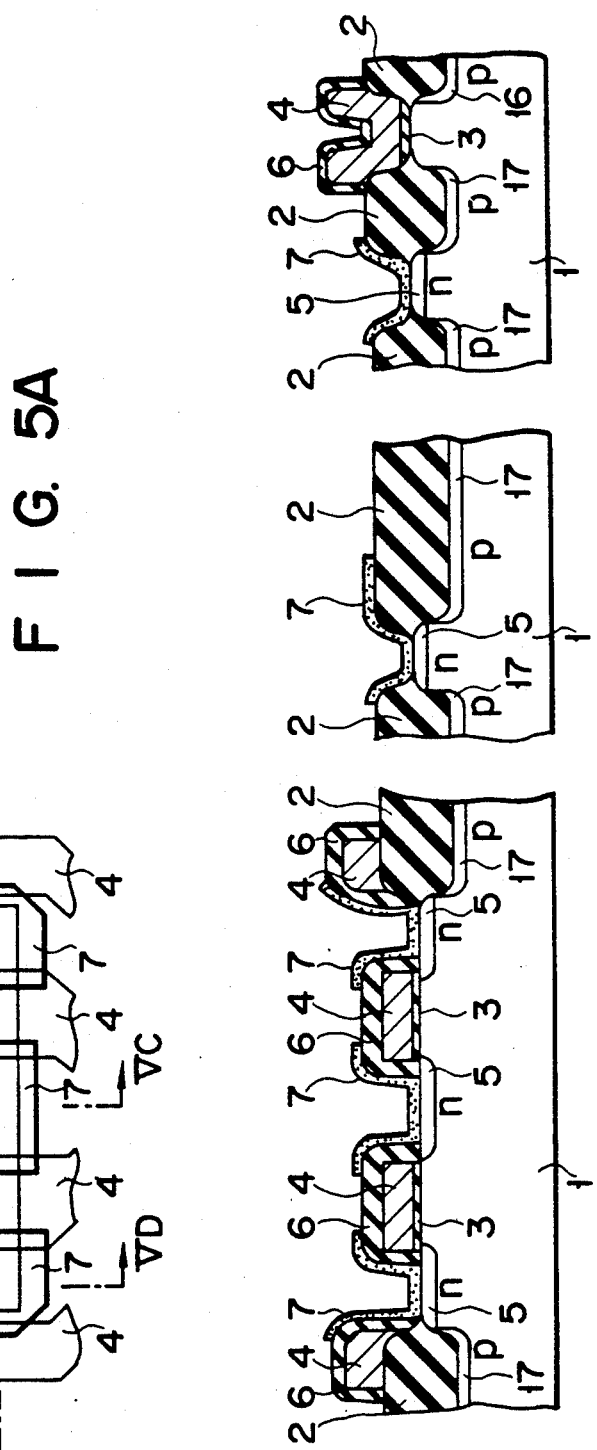
FIG. 5A
FIG. 5B
FIG. 5C
FIG. 5D

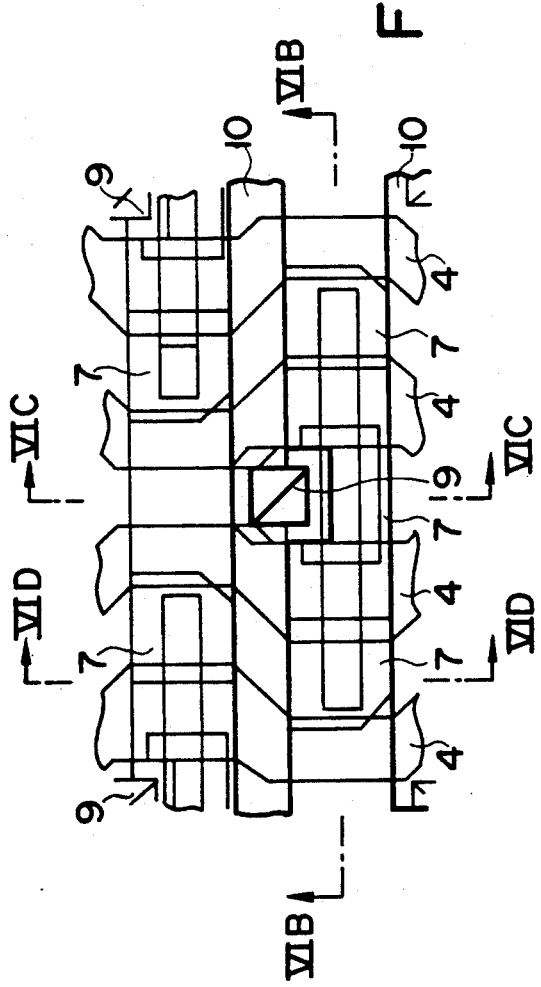
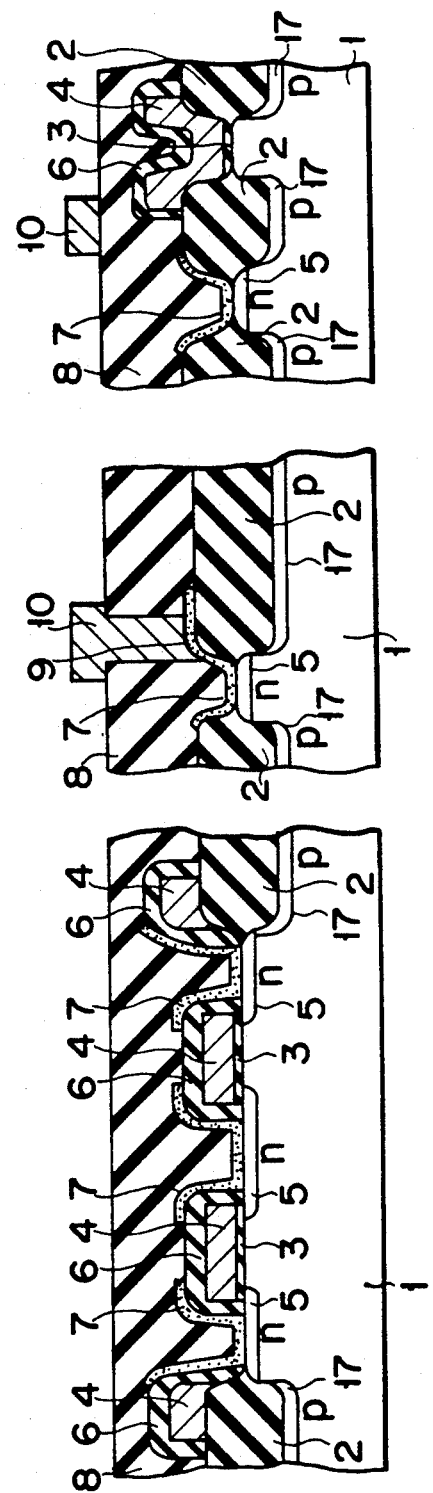
FIG. 6A
FIG. 6B
FIG. 6C
FIG. 6D

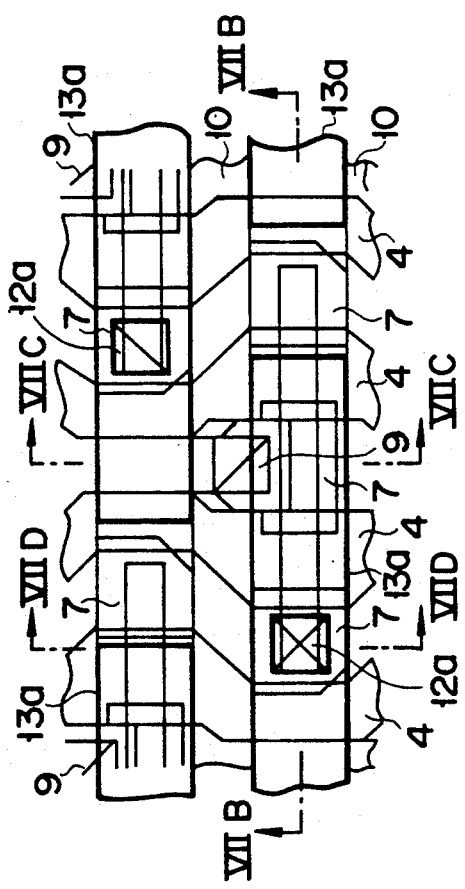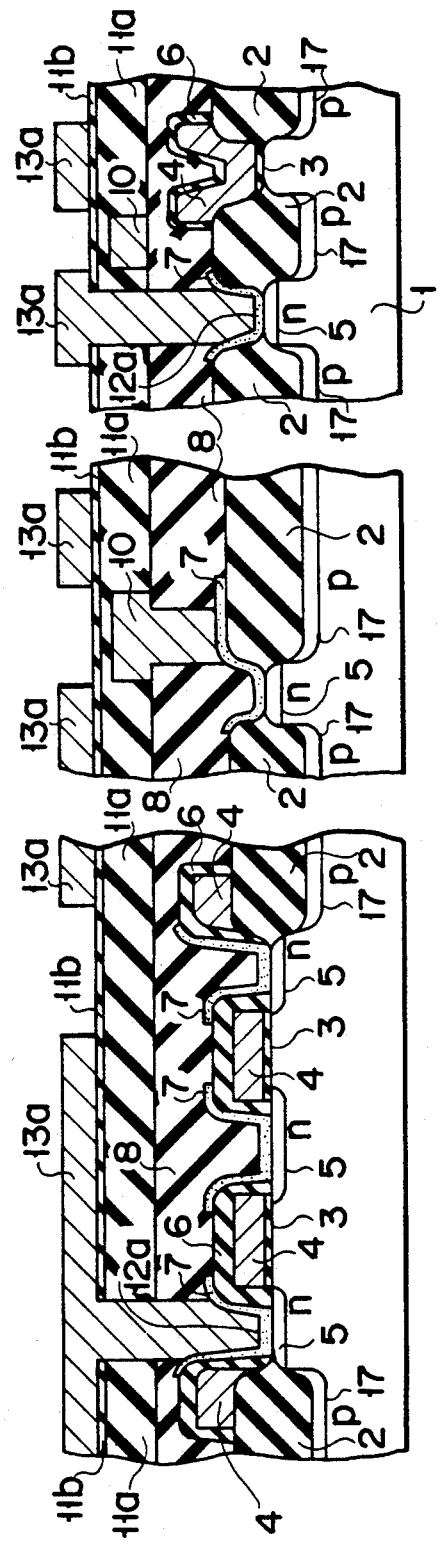
FIG. 7A
FIG. 7B  FIG. 7C  FIG. 7D

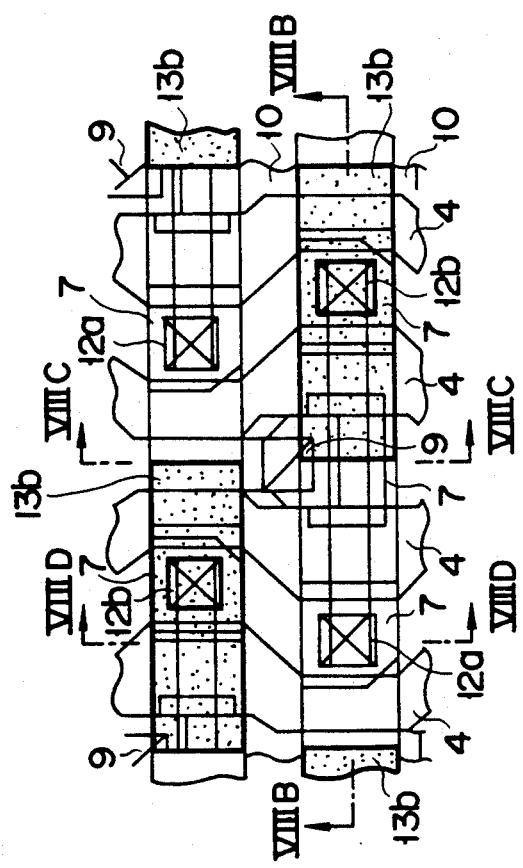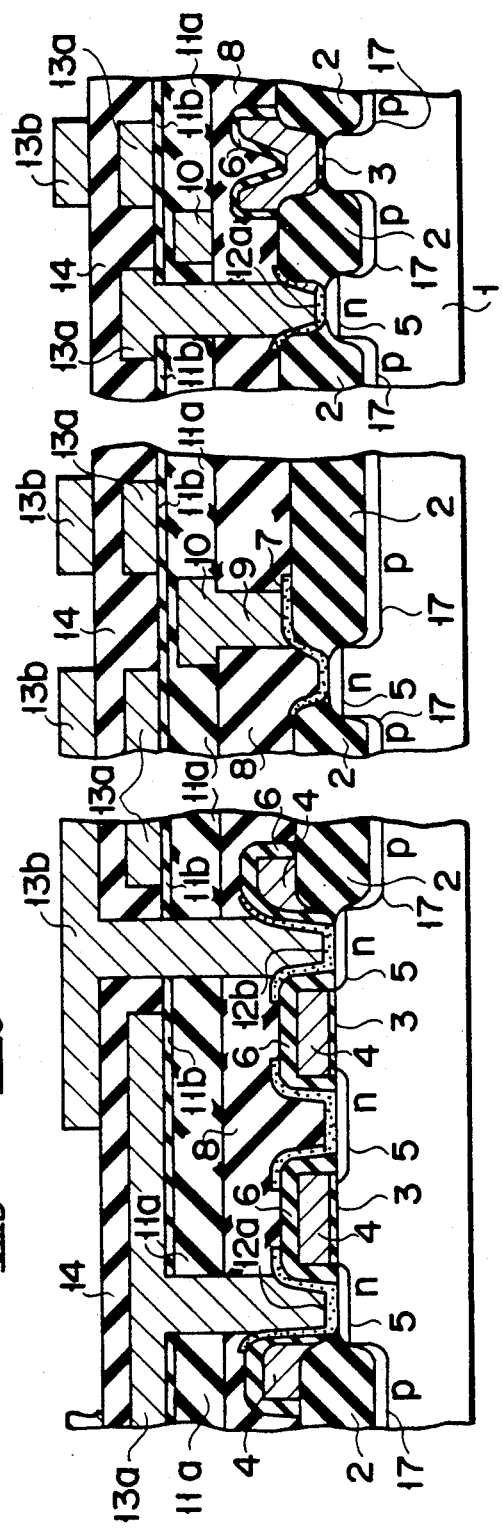
FIG. 8A FIG. 8B FIG. 8C FIG. 8D

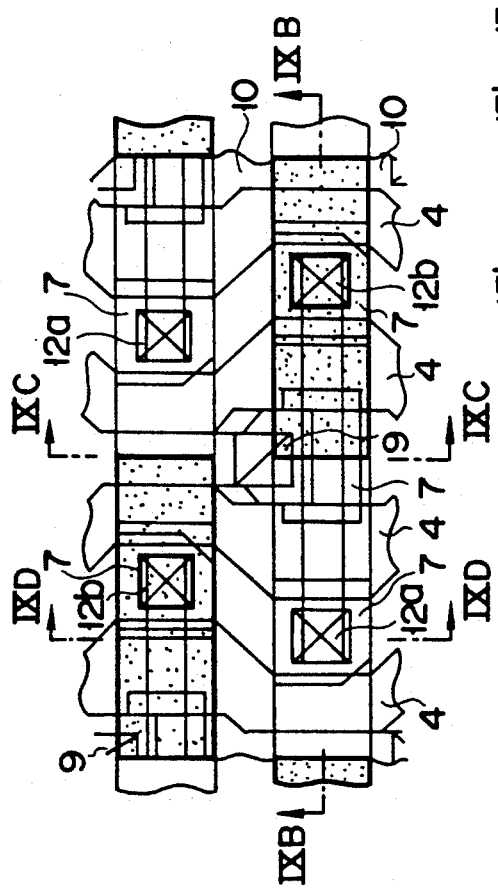

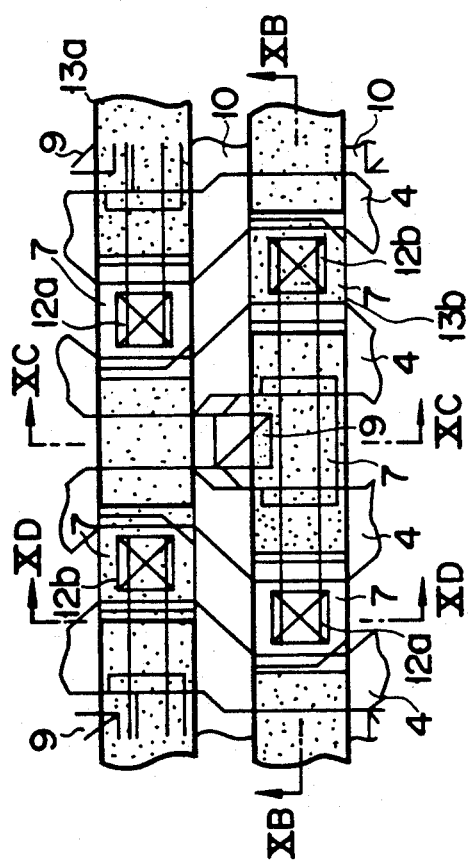

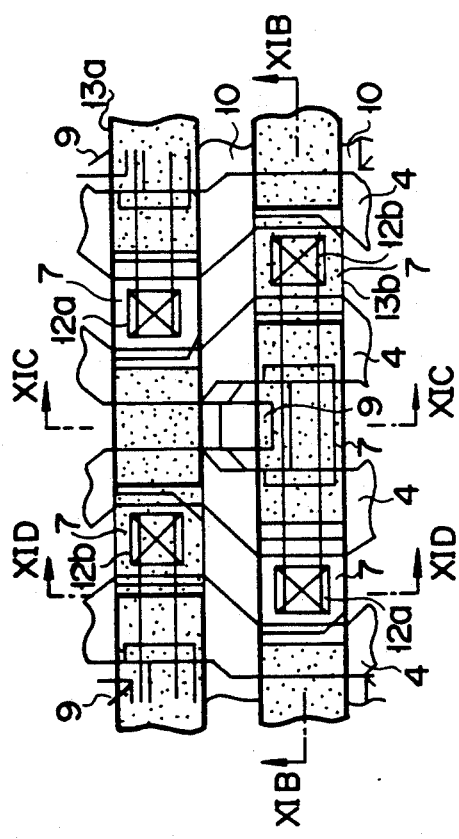
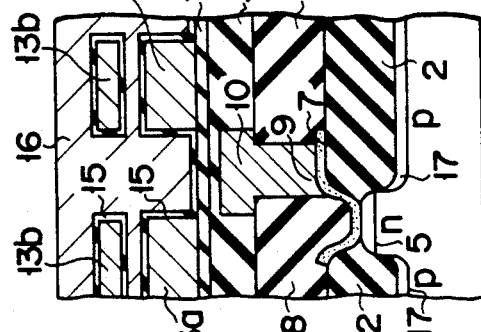
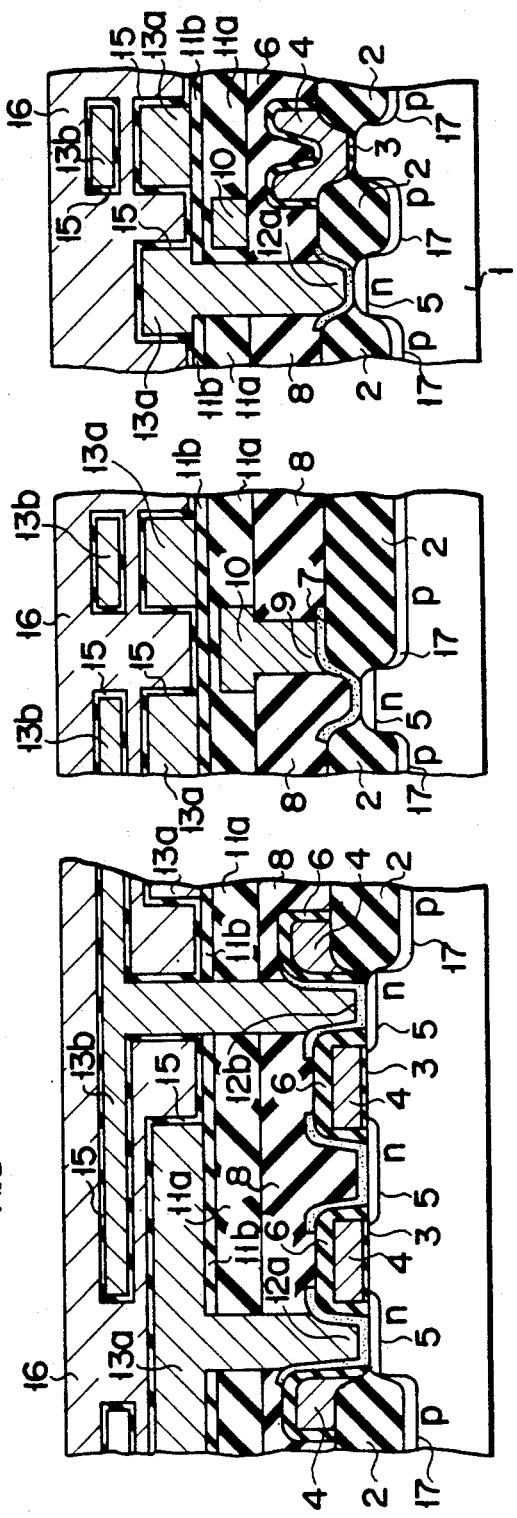

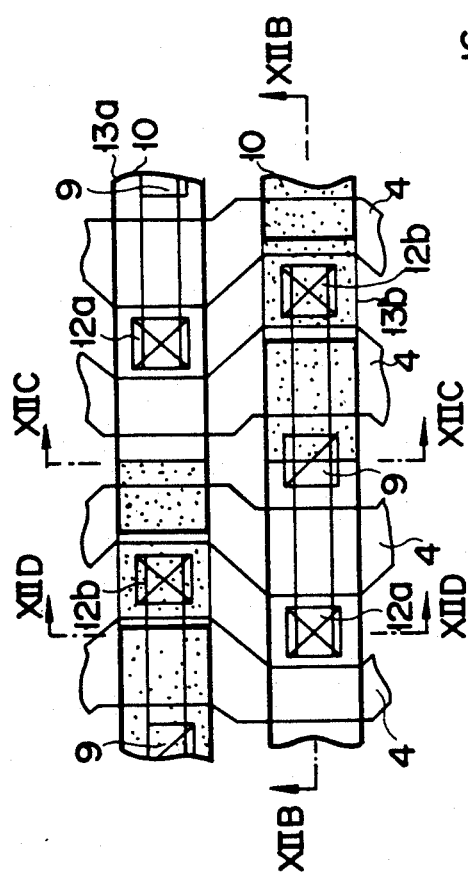
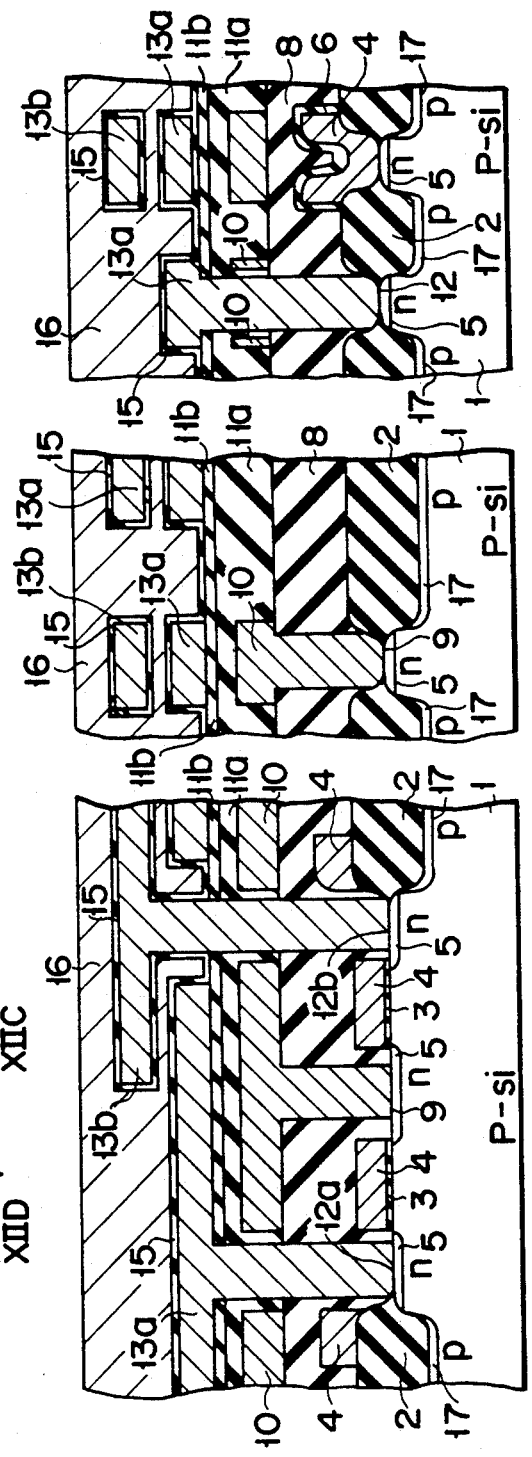
FIG. 12A
FIG. 12B
FIG. 12C
FIG. 12D

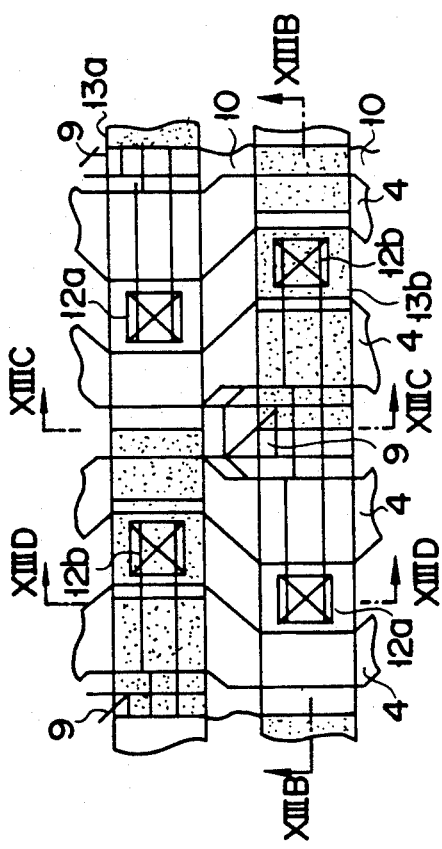
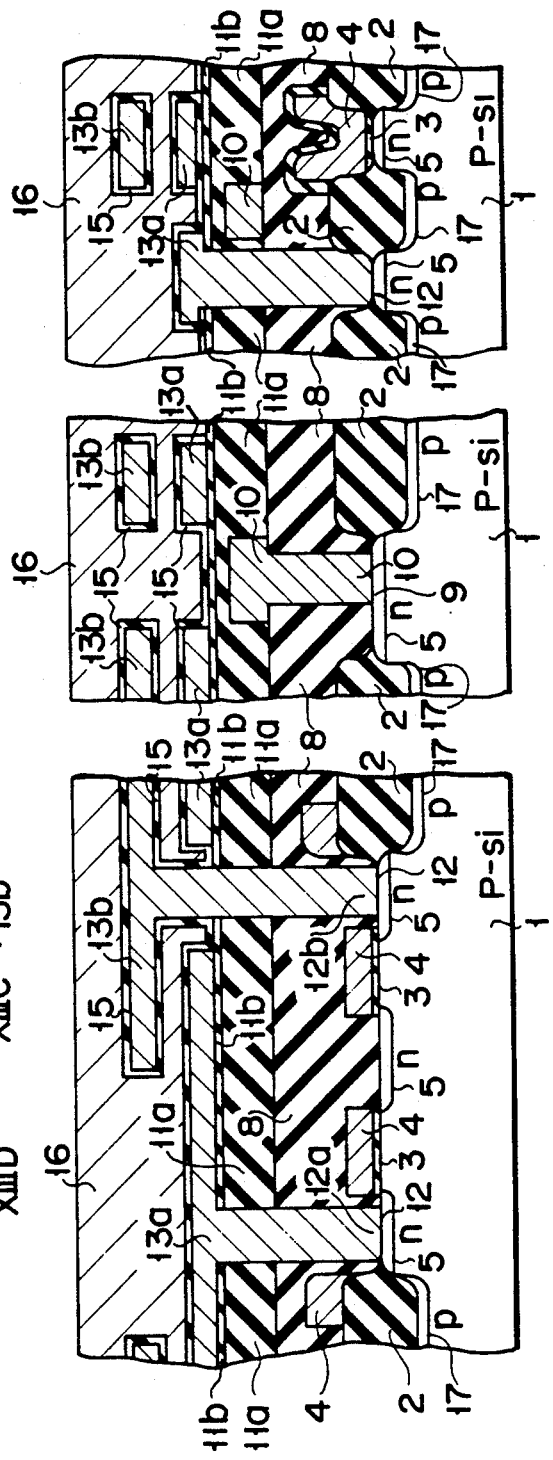
FIG. 13A
FIG. 13B
FIG. 13C
FIG. 13D

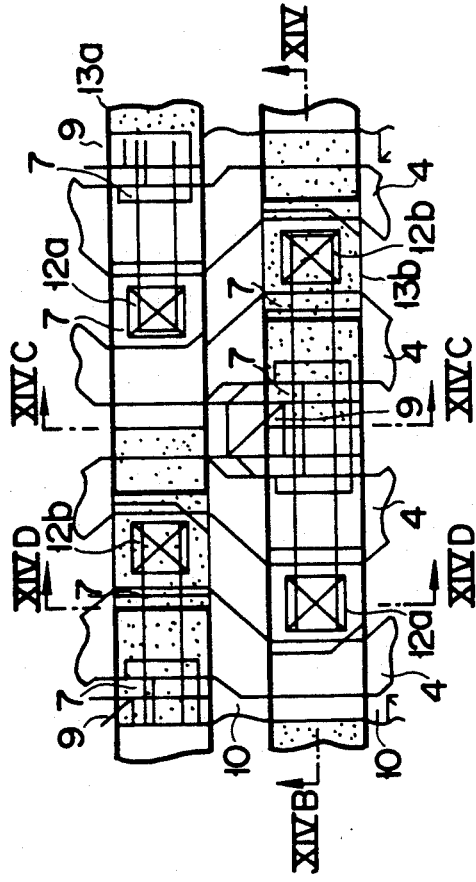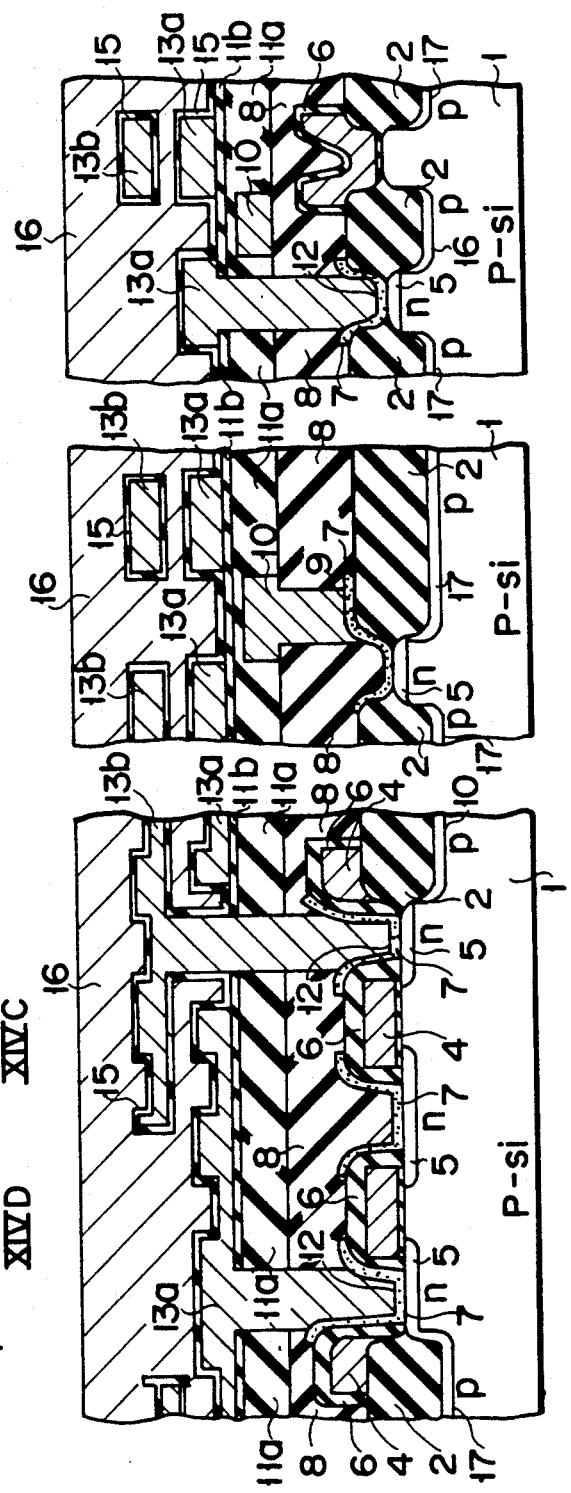
FIG. 14A  FIG. 14B  FIG. 14C  FIG. 14D

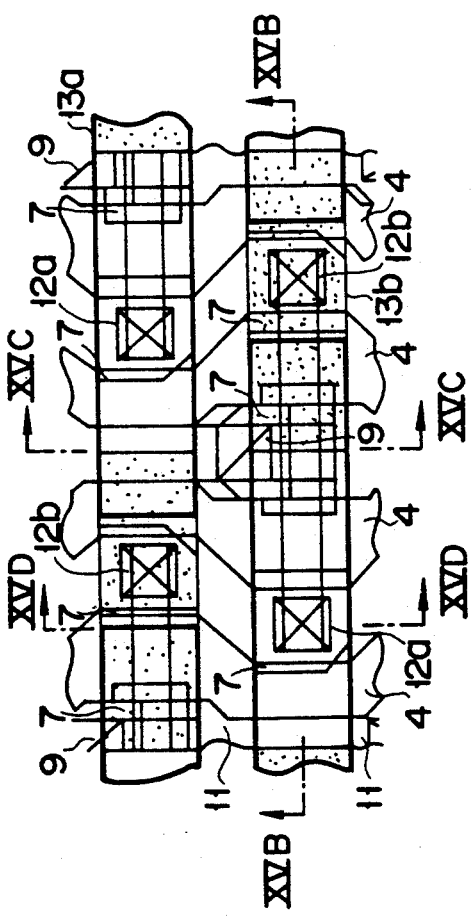
FIG. 15A
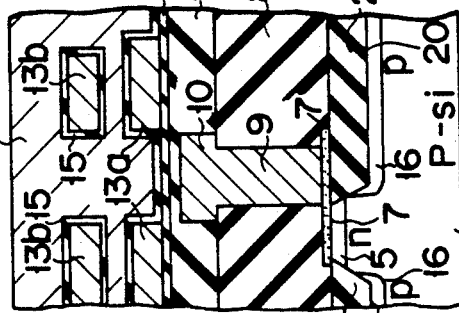
FIG. 15D
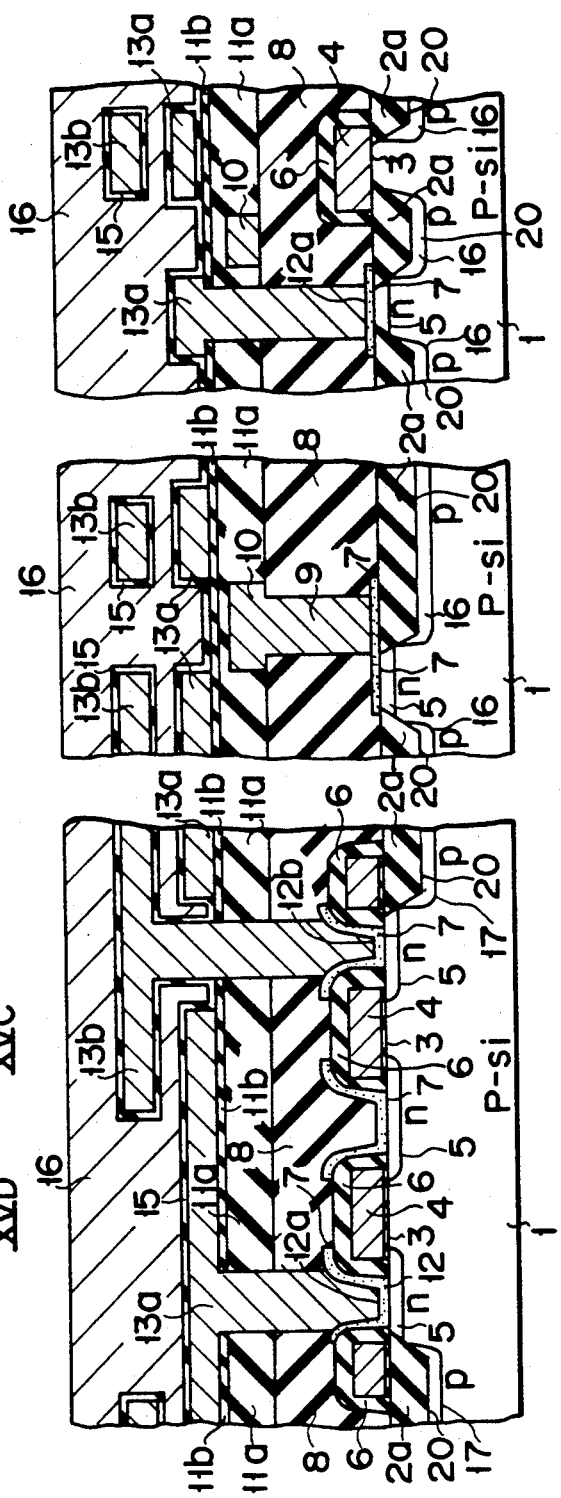
FIG. 15C
FIG. 15B

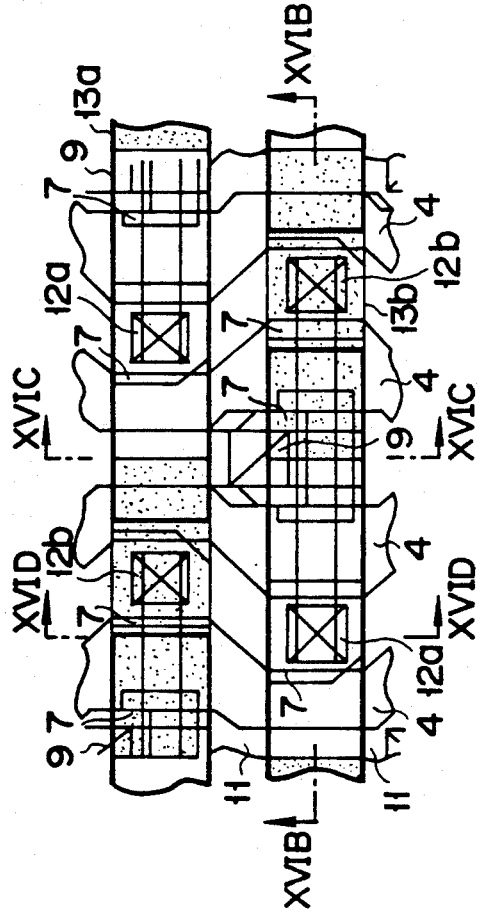
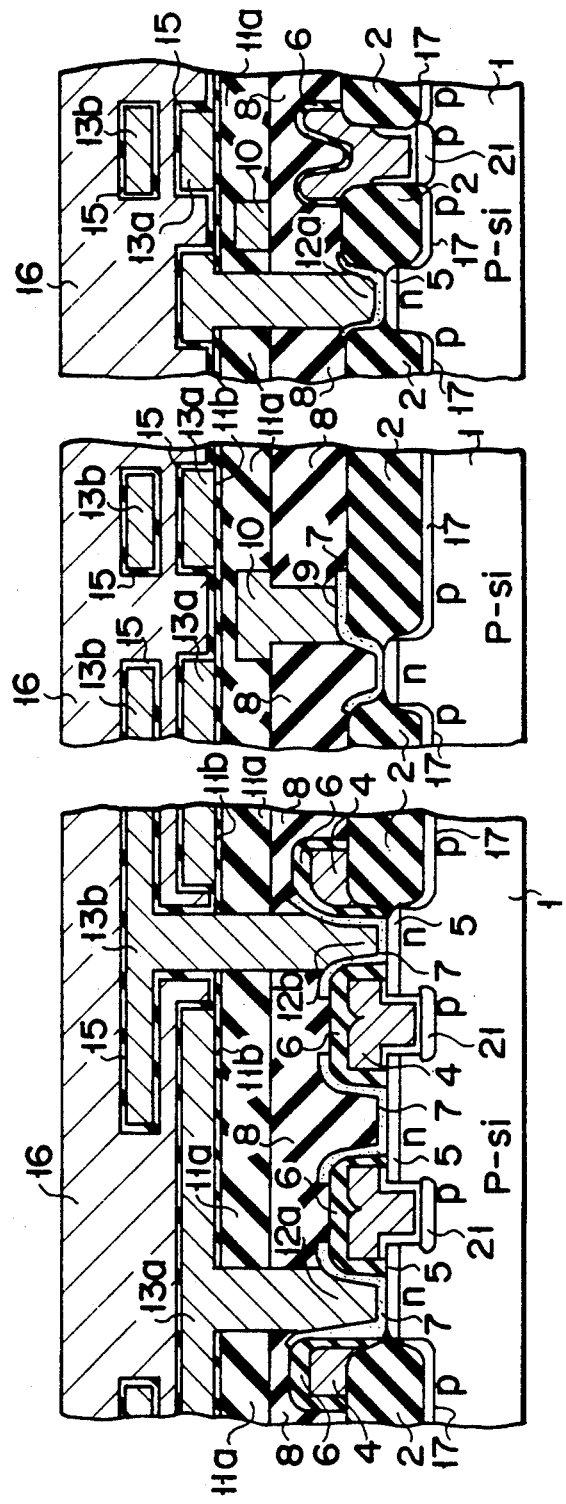
FIG. 16A
FIG. 16B
FIG. 16C
FIG. 16D

DYNAMIC RAM, HAVING AN IMPROVED LARGE CAPACITANCE

This application is a continuation of application Ser. No. 07/393,944, filed on Aug. 15, 1989, now abandoned.

BACKGROUND OF THE INVENTION

1. Field of the Invention

The present invention relates to a semiconductor device and, more particularly, to the cell structure of a dynamic RAM (DRAM), and also to a method of manufacturing the DRAM.

2. Description of the Related Art

The integration density of a MOS-type DRAM, which has memory cells each comprising one MOS transistor and one capacitor, is gradually increasing. The higher the integration density, the smaller the area occupied by the capacitor of each memory cell. The smaller the area of the capacitor, the less charge the capacitor accumulates. Consequently, destruction of the data in the memory cell, generally known as "soft error", is likely to take place.

To solve this problem a method has been proposed. In this method, a larger area is provided for the capacitor of each memory cell so that the capacitor can have greater capacitance to accumulate more charge, without sacrificing the integration density of the DRAM. A capacitor which has a double-stacked storage node is disclosed in T. Kisu et al., "Novel Storage Capacitance Enlargement Structure Using a Double-Stacked Storage Node in STC DRAM Cell", *Extended Abstract of the 20th (1988 International) Conference on Solid-State Devices and Materials,* Tokyo, 1988, pp. 581-584. The capacitance of this capacitor is relatively great, but is limited.

SUMMARY OF THE INVENTION

The first object of the present invention is to provide a DRAM which has a stacked capacitor cell structure and has memory cells each having an increased capacitance, without sacrificing the high integration density.

The second object of this invention is to provide a method of manufacturing the DRAM described above.

To attain the first object of the invention, there is provided a dynamic RAM which comprises:

a semiconductor substrate;

first and second MOS transistor formed on the semiconductor substrate, each having a source, a drain, and a gate;

a first insulation film formed on the first and second MOS transistors;

a first electrode formed on the first insulation film, for accumulating an electrical charge, said first electrode extending through a first hole made in the first insulation film and connected to one of the source and drain of the first MOS transistor;

a second electrode formed on the first insulation film, for accumulating an electrical charge, the second electrode extending through a second hole made in the first insulation film and connected to one of the source and drain of the second MOS transistor, and at least part of the second electrode being spaced apart from, located above, and overlapping part of the first electrode;

first and second capacitor-insulating films formed on the first and second electrodes, respectively; and a capacitor electrode formed on the first and second capacitor-insulating films and having a portion interposed between the overlapping parts of the first and second electrodes.

To attain the first object of the invention, there is provided another dynamic RAM which comprises:

a semiconductor substrate;

first and second MOS transistor formed on the semiconductor substrate, each having a source, a drain, and a gate which functions as a word line;

a first insulation film formed on the first and second MOS transistors;

a first bit line formed on the first insulation film, extending through a first hole made in the first insulation film and connected to one of the source and drain of the first MOS transistor;

a second bit line formed on the first insulation film, extending through a second hole made in the first insulation film and connected to one of the source and drain of the second MOS transistor;

a second insulation film formed on the first and second bit lines;

a first electrode formed on the second insulation film, for accumulating an electrical charge, said first electrode extending through a third hole made in the first and second insulation films and connected to the other of the source and drain of the first MOS transistor;

a second electrode formed on the second insulation film, for accumulating an electrical charge, the second electrode extending through a fourth hole made in the first and second insulation films and connected to the other of the source or drain of the second MOS transistor, and at least part of said second electrode being spaced apart from, located above, and overlapping part of the first electrode;

first and second capacitor-insulating films formed on the first and second electrodes, respectively; and a capacitor electrode formed on the first and second capacitor-insulating films and having a portion interposed between the overlapping parts of the first and second electrodes.

To achieve the second object of the invention, there is provided a method of manufacturing a dynamic RAM, which comprises the steps of:

forming first and second MOS transistors on a semiconductor substrate;

forming an insulation film on the first and second MOS transistors;

making a first hole in the insulation film and forming a first charge-accumulating electrode in the first hole, which is connected to one of the source and drain of the first MOS transistor;

forming a spacer film on the first charge-accumulating electrode;

making a second hole in the spacer film and the insulation film and forming a second charge-accumulating electrode in the second hole, which is connected to one of the source and drain of the second MOS transistor, at least part of the second charge-accumulating electrode being spaced apart from, located above, and overlapping part of the first charge-accumulating electrode;

performing isotropic etching on the spacer film, thereby removing the spacer film;

forming capacitor-insulating film covering the first and second charge-accumulating electrodes; and forming a capacitor electrode on the first and second charge-accumulating electrodes by means of chemical vapor deposition method, such that part of the capacitor electrode fills the gap between the overlapping parts of the first and second charge-accumulating electrodes.

In the memory cell according to the invention, the capacitor electrodes (i.e., storage-node electrodes), of the adjacent memory cells, for accumulating the electrical charges are formed of different layers. Therefore, they can overlap each other and can have a large surface (i.e., charge-storage area), even if the size of each memory cell is relatively small. Hence, the capacitor of each memory cell can accumulate a sufficient amount of electrical charge even if the memory cell is made small. Stated otherwise, the capacitor can have a sufficiently great capacitance, without reducing the thickness of the capacitor insulation film.

Since the capacitor electrode is located above the bit line, there is no limitation to the area which capacitors can occupy. Hence, capacitors, which are sufficiently large and have a sufficiently great capacitance, can be formed.

Further, since only a gate electrode is present below the bit line while forming the bit line, the structure has a flat surface, and is easy to process.

In addition, there is no need to make openings in the capacitor electrode (which functions as a plate), and to use these openings as contact holes for the bit line. Thus, even if the capacitor electrode is thick enough to accumulate a great amount of electrical charge, both the bit line and the capacitor electrode can be processed with ease.

When both capacitor insulation films are made of highly dielectric material such as $Ta_2O_5$, it is necessary to carry out as less heat treatments as possible after the capacitor insulation films have been formed. In the method according to the present invention, it is only the step of forming the capacitor electrode that is a heat treatment performed after the forming of the capacitor insulation films. Hence, the capacitor insulation films can be made of greatly dielectric material.

As has been described, each stacked-capacitor memory cell of the DRAM according to the present invention has a sufficiently large charge-storage area. Moreover, the memory cell has a flat surface and is easy to process, unlike the stacked-capacitor cells manufactured by the conventional methods.

BRIEF DESCRIPTION OF THE DRAWINGS

Other objects and advantages of the invention will be apparent from the following description, taken in conjunction with the accompanying drawings, in which:

FIG. 1A is a plan view showing a 4-bit DRAM according to a first embodiment of the present invention;

FIG. 1B is a cross-sectional view, taken along line IB—IB in FIG. 1A;

FIG. 1C is also a cross-sectional view, taken along line IC—IC in FIG. 1A;

FIG. 1D is another cross-sectional view, taken along line ID—ID in FIG. 1A;

FIGS. 2A to 9A, FIGS. 2B to 9B, FIGS. 2C to 9C, and FIGS. 2D to 9D are diagrams, all explaining the method of manufacturing the DRAM according to the first embodiment of the invention, and more precisely:

FIGS. 2A to 9A are plan views;

FIG. 2B is a cross-sectional view, taken along line IIB—IIB in FIG. 2A;

FIG. 2C is also a cross-sectional view, taken along line IIC—IIC in FIG. 2A;

FIG. 2D is another cross-sectional view, taken along line IID—IID in FIG. 2A;

FIG. 3B is a cross-sectional view, taken along line IIIB—IIIB in FIG. 3A;

FIG. 3C is a cross-sectional view, taken along line IIIC—IIIC in FIG. 3A;

FIG. 3D is also a cross-sectional view, taken along line IIID—IIID in FIG. 3A;

FIG. 4B is a cross-sectional view, taken along line IVB—IVB in FIG. 4A;

FIG. 4C is a cross-sectional view, taken along line IVC—IVC in FIG. 4A;

FIG. 4D is also a cross-sectional view, taken along line IVD—IVD in FIG. 4A;

FIG. 5B is a cross-sectional view, taken along line VB—VB in FIG. 5A;

FIG. 5C is a cross-sectional view, taken along line VC—VC in FIG. 5A;

FIG. 5D is a cross-sectional view, taken along line VD—VD in FIG. 5A;

FIG. 6B is a cross-sectional view, taken along line VIB—VIB in FIG. 6A;

FIG. 6C is a cross-sectional view, taken along line VIC—VIC in FIG. 6A;

FIG. 6D is a cross-sectional view, taken along line VID—VID in FIG. 6A;

FIG. 7B is a cross-sectional view, taken along line VIIB—VIIB in FIG. 7A;

FIG. 7C is a cross-sectional view, taken along line VIIC—VIIC in FIG. 7A;

FIG. 7D is a cross-sectional view, taken along line VIID—VIID in FIG. 7A;

FIG. 8B is a cross-sectional view, taken along line VIIIB—VIIIB in FIG. 8A;

FIG. 8C is a cross-sectional view, taken along line VIIIC—VIIIC in FIG. 8A;

FIG. 8D is a cross-sectional view, taken along line VIIID—VIIID in FIG. 8A;

FIG. 9B is a cross-sectional view, taken along line IXB—IXB in FIG. 9A;

FIG. 9C is a cross-sectional view, taken along line IXC—IXC in FIG. 9A;

FIG. 9D is a cross-sectional view, taken along line IXD—IXD in FIG. 9A;

FIG. 10A is a plan view showing a DRAM according to a second embodiment of the present invention;

FIG. 10B is a cross-sectional view, taken along line XB—XB in FIG. 10A;

FIG. 10C is a cross-sectional view, taken along line XC—XC in FIG. 10A;

FIG. 10D is a cross-sectional view, taken along line XD—XD in FIG. 10A;

FIG. 11A is a plan view showing a DRAM according to a third embodiment of the present invention;

FIG. 11B is a cross-sectional view, taken along line XIB—XIB in FIG. 11A;

FIG. 11C is a cross-sectional view, taken along line XIC—XIC in FIG. 11A;

FIG. 11D is a cross-sectional view, taken along line XID—XID in FIG. 11A;

FIG. 12A is a plan view showing a DRAM according to a fourth embodiment of the present invention;

FIG. 12B is a cross-sectional view, taken along line XIIB—XIIB in FIG. 12A;

FIG. 12C is a cross-sectional view, taken along line XIIC—XIIC in FIG. 12A;

FIG. 12D is a cross-sectional view, taken along line XIID—XIID in FIG. 12A;

FIG. 13A is a plan view showing a DRAM according to a fifth embodiment of the present invention;

FIG. 13B is a cross-sectional view, taken along line XIIIB—XIIIB in FIG. 13A;

FIG. 13C is a cross-sectional view, taken along line XIIIC—XIIIC in FIG. 13A;

FIG. 13D is a cross-sectional view, taken along line XIIID—XIIID in FIG. 13A;

FIG. 14A is a plan view showing a DRAM according to a sixth embodiment of the present invention;

FIG. 14B is a cross-sectional view, taken along line XIVB—XIVB in FIG. 14A;

FIG. 14C is a cross-sectional view, taken along line XIVC—XIVC in FIG. 14A;

FIG. 14D is a cross-sectional view, taken along XIV-D—XIVD in FIG. 14A;

FIG. 15A is a plan view showing a DRAM according to a seventh embodiment of the present invention;

FIG. 15B is a cross-sectional view, taken along XVB—XVB in FIG. 15A;

FIG. 15C is a cross-sectional view, taken along line XVC—XVC in FIG. 15A;

FIG. 15D is a cross-sectional view, taken along line XVD—XVD in FIG. 15A;

FIG. 16A is a plan view showing a DRAM according to an eighth embodiment of the present invention;

FIG. 16B is a cross-sectional view, taken along line XVIB—XVIB in FIG. 16A;

FIG. 16C is a cross-sectional view, taken along line XVIC—XVIC in FIG. 16A; and

FIG. 16D is a cross-sectional view, taken along line XVID—XVID in FIG. 16A.

DETAILED DESCRIPTION OF THE PREFERRED EMBODIMENTS

A DRAM according to a first embodiment of the present invention will now be described, with reference to FIGS. 1A to 1D, which show 4 memory cells arranged side, by side, along a bit line.

The memory cells are isolated from each other by the element-isolating insulation film 2 formed in p-type silicon substrate 1. Each memory cell has a MOS transistor. The MOS transistor comprises two n-type diffusion layers 5, a gate-insulating film 3 formed on a channel region between the layers 5, and a gate electrode 4 formed on the insulating film 3. The n-type diffusion layers 5 serve as a source region and a drain region, respectively.

A bit line 10 is connected by a bit-line contact 9 to a pad electrode 7. The pad electrode 7 is connected to the n-type diffusion layer 5.

A storage-node electrode 13a (i.e., charge-accumulating electrode) is formed above the bit line 10, and insulation films 11a and 11b. This electrode 13a is connected by a storage-node contact 12a to the pad electrode 7. Adjacent memory cell has a storage-node electrode 13b which is located above the storage-node electrode 13a. The electrode 13b is connected by a storage-node contact 12b to the pad electrode 7 of the adjacent memory cell. Each storage-node electrode 13b overlaps one storage-node electrode 13a. A capacitor region is formed in the gap between the storage-node electrodes 13a and 13b. Due to the gap between these electrodes 13a and 13b, the capacitor region has a great capacitance.

The sides of the storage-node electrodes 13a and 13b are used as capacitors. It is not difficult to pattern the bit line 10 even if the electrodes 13a and 3b are made thick so that the sides of the storage-node electrodes 13a and 13b can be used as capacitors. This is because capacitor-insulating film 15 is formed on the storage-node electrodes 13a and 13b, and capacitor electrode 16 is formed on the capacitor-insulating film 15 and, hence, located above the bit line 10. In this structure, no holes need to be made for forming contacts which extend to capacitor electrode 16. Therefore, it is unnecessary to form capacitor electrodes within the memory cells.

With reference to FIGS. 2A to 9D, it will be explained how the DRAM of the first embodiment is manufactured. The solid lines shown in FIGS. 2A, 3A, 4A, 5A, 6A, 7A, 8A, and 9A represent the patterns of the elements of the DRAM being formed in the consecutive steps of manufacture of the DRAM.

As is illustrated in FIGS. 2A to 2D, an oxide film 18 having a thickness of 50 nm is formed on a p-type silicon substrate 1 which has specific resistance of about 5 Ω·cm. A silicon nitride film 19 is formed on the oxide film 18, and both the oxide film 18 and the silicon nitride film 19 are pattered, thus forming a mask. Through this mask, boron are injected into the substrate 1, thereby forming channel-stopper layers 17.

Then, as is shown in FIGS. 3A to 3D, the substrate 1 is subjected to selective oxidation, forming an element-isolating film 2 made of silicon oxide and being 700 nm thick. During the selective oxidation, the impurities in the channel-stopper layers 17 diffuse downward and horizontally, below the element-isolating film 2. The element-isolating film 2 can be formed by any other method.

Next, as is illustrated in FIGS. 4A to 4D, a gate-insulating film 3 having a thickness of about 10 nm is formed on the substrate 1 by means of, for example, thermal oxidation. Then, a polycrystalline silicon film, about 200 nm thick, is deposited on the entire surface of the structure. Further, an insulation film having a thickness of approximately 200 nm is deposited by the means of, for example, CVD method, on the entire surface of the structure. The structure is subjected to reactive ion etching, whereby the polycrystalline silicon film and the insulation film are etched in part, thereby forming gate electrodes 4 and insulating films 6. Then, using the gate electrodes 4 and the insulation films 6 as a mask, ions of arsenic or phosphorus are injected into the substrate 1, thus forming n-type layers 5 having a depth of, for example, about 150 nm. Some of the n-type layers 5 will function as sources, and the other n-type layers 5 will function as drains. Next, an insulation film, about 100 nm thick, is deposited on the entire surface of the structure by means of, for example, the CVD method. This insulation film is subjected to the reactive ion etching, whereby insulation films 6a are left, self-aligned, on the sides of each gate electrode 4.

Next, as is illustrated in FIGS. 5A to 5D, a polycrystalline silicon film having a thickness of about 50 nm is deposited on the entire surface of the structure. Ions of arsenic or phosphorus are injected, or phosphorus is diffused, into this polycrystalline silicon film. After this impurity-doping, the polycrystalline silicon film is then subjected to reactive ion etching, thereby forming pad electrodes 7.

Thereafter, as is shown in FIGS. 6A to 6D, an insulation film 8 having a thickness of about 300 nm is deposited on the entire surface of the structure. More specifically, a $SiO_2$ film having a thickness of, for example, 10 nm is formed on the entire surface of the structure by means of CVD method. Then, a BPSG film, 350 nm thick, is deposited on the $SiO_2$ film. Further, a PSG film, 250 nm thick, is deposited on the BPSG film. Thereafter, the structure is heat-treated at 900° C., thus melting the PSG film and the BPSG film. Solution of ammonium fluoride is then applied to the structure, thereby etching the PSG film and the surface region of the BPSG film, whereby the insulation film 8 is formed. This film 8 is subjected to selective etching, i.e. reactive ion etching, thus making a bit-line contact hole 9 in the insulation film 9. Next, a polycrystalline silicon is deposited by means of, for example, CVD method on the entire surface of the structure. Further, molybdenum silicide is deposited on the entire surface of the structure, by means of sputtering or EB vapor-deposition. Then, reactive ion etching is performed, thus etching the polycrystalline silicon and the molybdenum silicide, thereby patterning the bit line 10. The surface of the substrate 1 is rather flat, and the insulation film 8 is easily made flat. Hence, it is not difficult to form bit lines on the insulation film 8. The surface at a contact portion of the bit line 10 is rather flat too. Therefore, it is not difficult to cover the bit line 10 by an insulation film.

Next, as is illustrated in FIGS. 7A to 7D, an insulation film 11a having a thickness of about 200 nm is deposited on the insulation film 8, covering the bit line 10. Further, another insulation film 11b is deposited on the insulation film 11a. Contact holes 12a are made in the insulation films 11b, 11a and 8, for forming first storage nodes, by means of reactive ion etching. Like the insulation film 8, the insulation film 11a is formed of a CVD $SiO_2$ film, a BPSG film, and a PSG film, which have thicknesses of 50 nm, 300 nm, and 250 nm, respectively, and has been formed by melting and etching the BPSG film and the BPSG film. The insulation film 11b is, for example, a CVD $Si_3N_4$ film which is 50 nm thick. Thereafter, a polycrystalline silicon film having a thickness of, for instance, 300 to 600 nm, is deposited on the entire surface of the structure. Ions of arsenic or phosphorus are injected into, or phosphorus is diffused into, this polycrystalline silicon film. Selective etching (i.e., reactive ion etching) is performed on the polycrystalline silicon film, thus doped with the impurity, thereby forming first storage-node electrodes 13a.

Then, as is illustrated in FIGS. 8A to 8D, a $CVDSiO_2$ film 14 having a thickness of about 200 nm is deposited on the entire surface of the structure. This film 14 and insulation films 11a, 11b, and 8 are subjected to selective etching (i.e., reactive ion etching), thus forming contact holes 12b for forming second storage-node contacts. Next, a polycrystalline silicon film having a thickness of 300 to 600 nm is deposited on the entire surface of the structure. Ions of arsenic or phosphorus are injected into, or phosphorus is diffused into, this polycrystalline silicon film. After this impurity doping, a photoresist mask is formed on the polycrystalline silicon film. Using this mask, selective etching, i.e., reactive ion etching, is performed on the polycrystalline silicon film, thus forming second storage-node electrodes 13b.

Next, as is shown in FIGS. 9A to 9D, the $CVDSiO_2$ film 14 is isotropically etched with $NH_4F$, thus removing the $CVDSiO_2$ film 14. Although the $CVDSiO_2$ film 14 is etched with $NH_4F$, the $Si_3N_4$ film 11b is not etched at all with this etchant. Therefore, the first storage-node electrodes 13a and the second storage-node electrodes 13a are exposed. In the next step, a silicon nitride film having a thickness of about 10 nm is deposited by low pressure CVD method on the entire surface of the structure. The structure is subjected to oxidation in a water-vapor atmosphere at 900° C. for 30 minutes, thus forming a capacitor-insulating film 15 on the entire surface of the structure. This film 15 consists of a silicon oxide film and a silicon nitride film, formed one upon the other. Nonetheless, it can be a single-layer film or a stacked layer of a $Ta_2O_5$ film and a silicon nitride film, provided it is made of any material which can be used as a capacitor insulation film.

Finally, as is illustrated in FIGS. 1A to 1D polycrystalline silicon is deposited on the entire surface of the structure. Ions of arsenic or phosphorus are injected into, or phosphorus is diffused into, the polycrystalline silicon film, and the polycrystalline silicon film is patterned, thus forming a plate electrode 16. The main cell section of the DRAM is thus completed. Since the plate electrode 16 can be formed as a common electrode of the memory cell array, no holes need to be made in this electrode for forming bit-line contacts.

In the first embodiment described above, the storage-node electrodes 13a and 13b and the plate electrode 16 are made of polycrystalline silicon. They can be made of other materials such as tungsten (W).

As is evident from FIGS. 7A and 8A, the first storage-node electrodes 13a and the second storage-node electrodes 13b are arranged in a checkerboard pattern. Therefore, the area between facing portions in any two adjacent rows of a mask for forming the first storage-node electrodes 13a is reduced. The same holds true of the second storage-node electrodes 13b. Hence, th storage-node electrodes can be formed by photolithography with higher precision than in the case where they are arranged along the gate electrodes 4.

The DRAM according to a second embodiment of the invention will now be described, with reference to FIGS. 10A to 10D. In the second embodiment, not only the upper surface and the sides but also the lower surface of each first storage-node electrode are used as a capacitor region, while only the upper surface and the sides of each first storage-node electrode are used as capacitor regions in the first embodiment. Thus, the second embodiment can have capacitors which have greater capacitance than those of the capacitors formed in the first embodiment. This structure is obtained as follows. $CVDSiO_2$ film is formed on an $Si_3N_4$ insulation film 11b, the first storage-node electrode is formed on the $CVDSiO_2$ film, and then the $CVDSiO_2$ film 14 and the $CVDSiO_2$ film on the $Si_3N_4$ insulation film 11b have been etched. This method increases the capacitance of each capacitor, since it is possible to increase surface area of the first storage-node electrode which is used as a capacitor region.

The DRAM according to a third embodiment of the invention will now be described, with reference to FIGS. 11A to 11D. In the first embodiment, since the upper surface, lower surface, sides of each second storage-node electrode 13b are used as charge-accumulating regions, pattern area of the electrode 13b is made smaller than that of the first storage-node electrodes 13a. If the second storage-node electrode 13b have same pattern area as those of the first storage-node electrode 13a, the adjacent memory cells to be formed will have different capacitances. Thus, in the third embodiment, the first storage-node electrodes 13a are made thicker than the second storage-node electrodes 13b, whereby the difference in capacitance among the adjacent cells is minimized. More specifically, the first storage-node electrodes 13a are about 600 nm thick, whereas the second storage-node electrode 13b are about 200 nm thick. Since the electrodes 13a and 13b have these specific different thickness, they have surfaces of substantially the same area. Hence, the difference in capacitance among the adjacent memory cells, to be formed, will be reduced.

The DRAM according to a fourth embodiment of the invention will now be described, with reference to FIGS. 12A to 12D. In the first embodiment, each bit line 10 is made on the element-isolating insulation film 2 located between the rows of memory cells, which extend paralleled to the word lines. Thus, the bit line 10 extends at right angles to the word line. Further, in order to obtain a predetermined space between bit lines, the bit line 10 contacts the pad electrode 7 formed on the element-isolating insulation film 2 and extending from the MOS diffusion layer 5. In the fourth embodiment, each contact 9 for bit line 10 is formed above an element region, and the holes made for forming storage-node contacts 12a and 12b can be formed by making opening through the bit lines 10. Hence, the bit lines 10 can exted straigth, whereby the patterning of the bit lines is easy to achieve.

The DRAM according to a fifth embodiment of the invention will now be described, with reference to FIGS. 13A to 13D. In the first embodiment, the bit lines 10 and the storage-node electrodes 13a and 13b are connected to the pad electrodes 7, which in turn are connected to the n-type diffusion layers 5. The purpose of using the pad electrodes 7 is to connect the bit lines 10 made on the element-isolating insulation film to the n-type diffusion layers 5 formed in the p-type silicon substrate 1. The use of the electrodes 7 no doubt means an increase in the number of electrodes. In the fifth embodiment, that portion of each n-type diffusion layer 5, which contacts the bit line 10, is extended to the element-isolating region, thereby connecting the bit line 10 to the n-type diffusion layer 5 without using the pad electrodes 7.

The DRAM according to a sixth embodiment of the invention will now be described, with reference to FIGS. 14A to 14D. In the first embodiment, the storage-node electrodes 13a and 13b are rectangular parallelopipeds, each having two parallel, rectangular major faces and four rectangular side faces continuous to these major faces. In the sixth embodiment, after forming rectangular parallelopiped storage-node electrodes 13a, 13b, grooves are cut in the center part of the upper surface of each storage-node electrode, extending at right angles to the word lines, thereby increasing the area of the upper surface of the storage-node electrode. As a result of this, each memory cell will have an increased capacitance. Alternatively, a recess can be made in the center part of the upper surface of each storage-node electrode. In this case, the capacitance of each memory cell will also increase. Further, the surface of the storage-node electrode can be processed in any other way to increase the capacitance of the memory cells.

The DRAM according to a seventh embodiment of the present invention will now be described with reference to FIGS. 15A to 15D. The element-isolating insulation film of the first embodiment is a field insulation film formed by selective oxidation. In the seventh embodiment, use is made an element-isolating insulation film of a trenched type. More specifically, trenches 20 are made in the surface of a silicon substrate 1, and then an element-isolating insulation film 2a is buried in these trenches 20 by CVD method. This film 2a can be made of silicon oxide. Alternatively, it can be a two layered film consisting of an $SiO_2$ film formed on the inner surfaces of the trenches 20 and a polycrystalline silicon film having a thickness of 100 nm and formed on the $SiO_2$ film. The sides of each trench 20 can be either vertical or inclined.

The DRAM according to an eighth embodiment of the present invention will now be described with reference to FIGS. 16A to 16D. The DRAM of this embodiment has MOS transistors of a type different from the planar-channel MOS transistors of the first embodiment. A stacked memory cell of the same type used in the present invention has a MOS transistor made in the lowest layer. This means that the MOS transistor is subjected to a heat treatment performed, for example, at 900° C. for about 400 minutes at the time of forming a MOS capacitor. The MOS transistor is thus likely to be affected by this heat treatment. The DRAM of the eighth embodiment has trenched MOS transistors which are immune to an intense heat treatment. The channels of the trenched MOS transistor extend along a trench made in the surface of the substrate. More precisely, p-type layers 21, which are the effective channel regions of the trenched MOS transistors, are formed on the bottom of the trench and spaced apart from each other. Since $P^-$-type layers (having a low impurity concentration) are formed on the sides of the trench, each trenched MOS transistor has a high drain breakdown voltage. The memory cells, each having a trenched MOS transistor, are smaller than those each having a planar-channel MOS transistor.

Various changes and modification can be made without departing the scope of the present invention. For example, an aluminum wire can be formed above the plate electrode, and be put in contact with the word line for every 32 memory cells, thereby to reduce the resistance of the word line. In short, shunt technique can be employed.

Further, the insulation films 8 and 11 can be formed by means of biased sputtering to have smooth surfaces, instead of the melting process applied in the embodiments described above.

Moreover, the storage-node electrodes can consist of three layers, four layers, or more layers, instead of only two layers as in the embodiments described above. Each of the storage-node electrode has an increased surface area by overlapping these layers, whereby the capacitor of the memory cell accumulates sufficient electrical charge, without necessity of reducing the thickness of the capacitor insulation film, when the memory cell is made smaller.

What is claimed is:

1. A dynamic RAM comprising:
   a semiconductor substrate;
   first and second MOS transistors, each having a source, a drain, and a gate, said source and drain being formed in said substrate;
   a first insulating film formed on said first and second MOS transistors;
   a first electrode, having first and second surfaces and formed over said first insulation film, for accumulating an electrical charge, said first electrode extending through a first hole made in said first insulating film and connected to one of the source and drain of said first MOS transistor;
   a second electrode, having third and fourth surfaces and formed over said first insulation film, for accumulating an electrical charge, said second electrode extending through a second hole made in said first insulation film and connected to one of the source and drain of said second MOS transistor, and at least one part of said second electrode being spaced apart from, located above, and overlapping part of said first electrode, the one part of said second electrode overlapping a part of said first electrode being over said first and second MOS transistors formed in said semiconductor substrate;

first and second capacitor-insulating films encapsulating the first and second surfaces of said first electrode and the third and fourth surfaces of said second electrode, respectively, and a capacitor electrode formed on said first and second capacitor-insulating films and having a portion interposed between the overlapping parts of said first and second electrodes, said capacitor electrode facing the first and second surfaces of said first electrode with said first capacitor-insulating film interposed between said first and second surfaces, and said capacitor electrode facing the third and fourth surfaces of said second electrode with said second capacitor-insulating film interposed between said third and fourth surfaces and said capacitor electrode, one part of said capacitor electrode being over said first and second MOS transistors formed in said semiconductor substrate.

2. The dynamic RAM according to claim 1, wherein groups of MOS transistors identical to said first and second MOS transistors are formed in said semiconductor substrate, and a plurality of electrodes identical to said first and second electrodes are arranged in an alternating pattern.

3. The dynamic RAM according to claim 1, wherein a space is formed between said first capacitor-insulating film and said first insulating film, and a part of said capacitor electrode is interposed in said space between said first capacitor-insulating film and said first insulation film.

4. The dynamic RAM according to claim 1, wherein a surface of said first electrode which opposes said capacitor electrode has the same area as a surface of said second electrode which opposes said capacitor electrode.

5. A dynamic RAM comprising:

a semiconductor substrate;

first and second MOS transistors, each having a source, a drain, and a gate which functions as a word line, said source and drain being formed in said substance, one of said source and drain of said first MOS transistor being integrally formed with one of said source and drain of said second MOS transistor;

a first insulation film formed on said first and second MOS transistors;

a bit line having a contact portion extending through a first contact hole made in said first insulation film and connected to said one of the source and drain of said first MOS transistor, said bit line extending across the word linkes with an offset against a position of the contact portion;

a second insulation film formed on the contact portion of said bit line;

a first electrode, having first and second surfaces and formed over said first and second insulation films, for accumulating an electrical charge, said first electrode extending through a second contact hole made in said first and second insulation films and connected to the other of the source and drain of said first MOS transistor;

a second electrode, having third and fourth surfaces and formed over said first and second insulation films, for accumulating an electrical charge, said second electrode extending through a third contact hole made in the first and second insulation films and connected to the other of the source and drain of said second MOS transistor, and at least one part of said second electrode being spaced apart from, located above, and overlapping part of said first electrode, the one part of said second electrode overlapping a part of said first electrode being over said first and second MOS transistors formed in said semiconductor substrate;

first and second capacitor-insulating films encapsulating the first and second surfaces of said first electrode and the third and fourth surfaces of said second electrode, respectively; and a capacitor electrode formed on said first and second capacitor-insulating films and having a portion interposed between the overlapping parts of said first and second electrodes, said capacitor electrode facing the first and second surfaces of said first electrode with said first capacitor-insulating film interposed between said first and second surfaces, and said capacitor electrode facing the third and fourth surfaces of said second electrode with said second capacitor-insulating film interposed between said third and fourth surfaces, one part of said capacitor electrode being over said first and second MOS transistors formed in said semiconductor substrate.

6. The dynamic RAM according to claim 5, wherein groups of MOS transistors identical to said first and second MOS transistors are formed in said semiconductor substrate, and a plurality of electrodes identical to said first and second electrodes are arranged in an alternating pattern.

7. The dynamic RAM according to claim 5, wherein a space is formed between said first capacitor-insulating film and said first insulating film, and a part of said capacitor electrode is interposed in said space between said first capacitor-insulating film and said first insulation film.

8. The dynamic RAM according to claim 5, wherein a surface of said first electrode which opposes said capacitor electrode has the same area as a surface of said second electrode which opposes said capacitor electrode.

9. The dynamic RAM according to claim 5, wherein said first bit line is connected to said one of the source and drain of said first MOS transistor by a first pad electrode, said first electrode is connected to said other of the source and drain of said first MOS transistor by a second pad electrode, said second bit line is connected to said one of the source and drain of said second MOS transistor by a third pad electrode, and said second electrode is connected to said other of the source and drain of said second MOS transistor by a fourth pad electrode.

10. The dynamic RAM according to claim 5, wherein said first and second bit lines are formed on an element-isolating region, and intersects at right angles with the word lines formed of the gates of said first and second MOS transistors.

11. The dynamic RAM according to claim 5, wherein said first bit line is connected to said one of the source and drain of said first MOS transistors by a first pad electrode, said second bit line is connected to said one of the source and drain of said second MOS transistor by a second pad electrode, and said first and second pad electrodes extends onto an element isolation region.

12. The dynamic RAM according to claim 5, wherein said each one of the source and drain of said first and second MOS transistors have regions extending toward said word line, and said first and second bit lines are connected to the regions.

* * * * *